United States Patent
Wong

(10) Patent No.: US 7,314,157 B2
(45) Date of Patent: Jan. 1, 2008

(54) WIRE BOND WITH IMPROVED SHEAR STRENGTH

(75) Inventor: Yam Mo Wong, Singapore (SG)

(73) Assignee: ASM Technology Singapore Pte Ltd, Singapore (SG)

( * ) Notice: Subject to any disclaimer, the term of this patent is extended or adjusted under 35 U.S.C. 154(b) by 307 days.

(21) Appl. No.: 10/918,673

(22) Filed: Aug. 13, 2004

(65) Prior Publication Data

US 2006/0032894 A1    Feb. 16, 2006

(51) Int. Cl.
*B23K 31/00* (2006.01)
*B23K 1/06* (2006.01)

(52) U.S. Cl. .................... 228/180.5; 228/110.1

(58) Field of Classification Search ............ 228/180.5, 228/110.1, 1.1, 4.5
See application file for complete search history.

(56) References Cited

U.S. PATENT DOCUMENTS

| | | | | |
|---|---|---|---|---|
| 5,961,029 A * | 10/1999 | Nishiura et al. | ......... | 228/180.5 |
| 5,967,401 A * | 10/1999 | Nishiura et al. | ......... | 228/180.5 |
| 6,036,080 A * | 3/2000 | Takahashi et al. | ....... | 228/180.5 |
| 6,112,974 A * | 9/2000 | Nishiura et al. | ......... | 228/180.5 |
| 7,004,372 B2 * | 2/2006 | Mayer et al. | ............... | 228/102 |
| 7,044,357 B2 * | 5/2006 | Mii | ......................... | 228/180.5 |
| 7,064,433 B2 * | 6/2006 | Wong et al. | ................ | 257/737 |
| 2003/0166333 A1 * | 9/2003 | Takahashi | .................. | 438/617 |
| 2004/0104477 A1 * | 6/2004 | Fujisawa | .................... | 257/738 |
| 2004/0152292 A1 * | 8/2004 | Babinetz et al. | ............ | 438/617 |
| 2005/0072833 A1 * | 4/2005 | Wong et al. | ............. | 228/180.5 |
| 2005/0189567 A1 * | 9/2005 | Fujisawa | .................... | 257/200 |
| 2005/0191839 A1 * | 9/2005 | Wong et al. | ................ | 438/617 |

\* cited by examiner

*Primary Examiner*—Kiley Stoner
(74) *Attorney, Agent, or Firm*—Ostrolenk, Faber, Gerb & Soffen, LLP

(57) ABSTRACT

A wire bonding method and a wire bond formed from the method are provided to improve shear strength of a wire that is connected to a bonding surface. The wire bond includes a bonded wire having a base in contact with the bonding surface, a recessed portion formed substantially at an edge of the bonded wire wherein at least a portion of an underside of the recessed portion is in contact with the bonding surface, and a length of wire extending from the recessed portion.

14 Claims, 2 Drawing Sheets

WIRE BOND WITH IMPROVED SHEAR STRENGTH

FIELD OF THE INVENTION

The invention relates to the formation of an electrical connection between a conductive wire and a connection or bonding pad of an electronic component, and in particular to forming a wire bond to attach the wire to the connection pad.

BACKGROUND AND PRIOR ART

In semiconductor packaging and assembly, it is sometimes necessary to form an electrical connection between different electronic components using conductive wire, or between different electrical contacts of an electronic component. Wire bonding is a method commonly used in the industry to form the electrical connection. One example is where a semiconductor die or integrated circuit chip is attached onto a carrier such as a leadframe. In this case, electrical connections have to be formed between electrical contacts on the die and corresponding electrical contacts on the leadframe. Thus, the wire needs to be bonded at one end to a lead of the leadframe and at the other end to a connection pad of the die. The most widely used wire materials are Gold (Au) and Aluminum (Al), but Silver (Ag) and Copper (Cu) are also used. The connection pads may comprise metallized bond sites on a semiconductor chip or on interconnection substrates or carriers.

A typical method used to bond or weld the wire to a connection pad is through a combination of heat, pressure and/or ultrasonic energy. It is a solid phase welding process, wherein the two metallic materials (the wire and the pad surface) are brought into intimate contact. Once the surfaces are in intimate contact, electron sharing or interdiffusion of atoms takes place, resulting in the formation of a wire bond. The bonding force can lead to material deformation, breaking up of a contamination layer and smoothing out of surface asperity, which can be enhanced by the application of ultrasonic energy. Heat can accelerate inter-atomic diffusion, thus forming the bond.

One type of prior art wire bond formation uses a ball bond. The process involves melting a sphere of wire material on a length of wire held by a capillary, which is lowered and welded to a first bonding position. This results in a bond with a circular smashed ball shape. The capillary then draws out a loop and then connects the wire to a second bond position using a stitch bond that is usually of a crescent shape. Another ball is then reformed for a subsequent first ball bond. Currently, gold ball bonding is the most widely used bonding technique. Its advantage is that once the ball bond is made on the connection pad of a device, the wire may be moved in any direction without stress on the wire, which greatly facilitates automatic wire bonding.

Current wire bonding techniques depend very much on the area of contact between the formed ball and the connection pad of the electronic device for adequately securing the connection. Over the years, the demand for fine-pitch bonding (such as with bond pads having pitches of less than 50 μm) has increased steadily, thus making effective bonding more difficult since there is a smaller surface area for contact between the wire bond and the connection pad. Furthermore, probe testing of semiconductor devices has become the norm. Probe testing may cause the surfaces of the connection pads to be damaged, leaving probe marks on the connection pads which might be rough or have an underlayer material exposed, thus adding to the difficulty to form an effective bond since good intermetallization is harder to achieve.

Another problem associated with fine-pitch bonding is that if an insufficient amount of ultrasonic energy or bond force is applied during bonding, ball lift occurs when the adhering force between the ball bond and the connection pad is not strong enough. Conversely, if too much ultrasonic energy or bond force is applied, this may lead to metal peel or cratering on the surface of the connection pad. Moreover, in fine-pitch ball bonding, a parameter window for forming a good bond is comparatively smaller. Therefore, the aforementioned faults would have a tendency to occur either due to the sensitivity of the connection pad of the wafer or other semiconductor device, or due to the parameters not being properly optimized.

In order to improve the intermetallization between the ball bond and the connection pad, one method is to increase the ball size. Unfortunately, the size of the ball is restricted to the size of the opening offered by the connection pad, which is smaller for smaller devices. Another method is to increase the ultrasonic energy transmitted to the ball bond during bonding. However, this method increases the risk of metal peel or cratering if the wafer or semiconductor device is sensitive.

If the adhesion of the wire to the bonding location is increased by increasing the contact surface area between the wire bond and the bonding location, this would also give rise to increased shear strength. In other words, it would require a greater force to dislodge the bond from the bonding location, so that the bond is more effective and reliable.

Using the aforesaid prior art bonding process to apply a single ball bond to the bonding pad, and relying on the adhesion of the single ball bond to the bonding pad to secure the bond, may not achieve sufficient shear strength to ensure reliability of the wire bond. It would be desirable to develop a wire bonding method and a wire bond that has increased shear strength that would meet the needs of fine-pitch wire bonding in modern wire bonding machines.

SUMMARY OF THE INVENTION

It is therefore an object of the invention to provide a wire bonding method and a wire bond that improves the adhesion of a wire bond to a bonding pad as compared to the aforesaid prior art.

According to a first aspect of the invention, there is provided a method for bonding a wire to a bonding surface with a bonding tool, comprising the steps of: contacting the bonding surface with the wire at a bonding location; applying bonding energy from the bonding tool to attach the wire to the bonding surface at a bonding point lying along a central longitudinal axis of the bonding tool; moving the bonding tool away from the bonding location; contacting the attached wire with the bonding tool at an offset position where the central longitudinal axis of the bonding tool is offset from the bonding point; then applying bonding force and power to deform the attached wire until an underside of the deformation not already in contact with the bonding surface contacts the bonding surface.

According to a second aspect of the invention, there is provided a wire bond comprising: a bonded wire having a base in contact with a bonding surface; a recessed portion substantially at an edge of the bonded wire wherein at least a portion of an underside of the recessed portion is in contact with the bonding surface; and a length of wire extending from the recessed portion.

It would be convenient hereinafter to describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

An example of a method of bonding and a formation of wire bond in accordance with the invention will now be described with reference to the accompanying drawings, in which.

DETAILED DESCRIPTION OF THE PREFERRED EMBODIMENT

Figure 1:
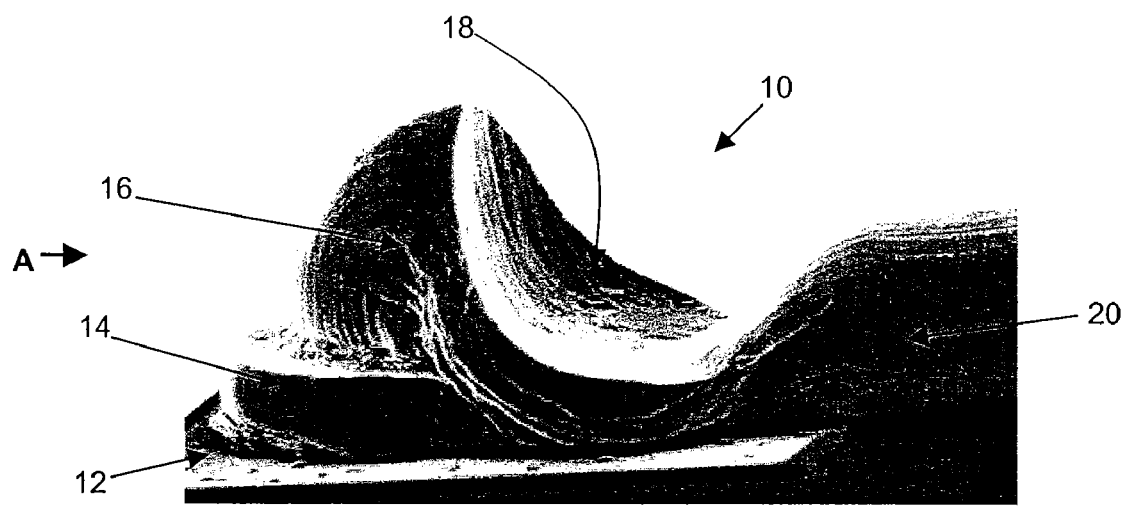
FIG. 1 is a side view of a ball bond formed according to the preferred embodiment of the invention.

FIG. 1 is a side view of a wire bond, such as a ball bond 10, formed according to the preferred embodiment of the invention. The ball bond 10 is welded or attached to a bonding pad 12, preferably at a first bonding position. The bonded wire includes a base portion 14 in contact with and adhering to the bonding pad 12, and a ball portion 16 on top of the base portion 14. The wire bond also includes a recessed portion 18 that is substantially at an edge of the bonded wire comprising the base portion 14 and ball portion 16. A length of wire 20 extends from the recessed portion 18 of the ball bond 10 towards a second bonding position (not shown) to which another wire bond is made to form a connection. A contact surface between the ball bond 10 and bonding pad 12 therefore includes the base portion 14 and underside of the recessed portion 18 in contact with the bonding pad 12. The recessed portion 18 may in itself comprise a stitch bond.

Figure 2:
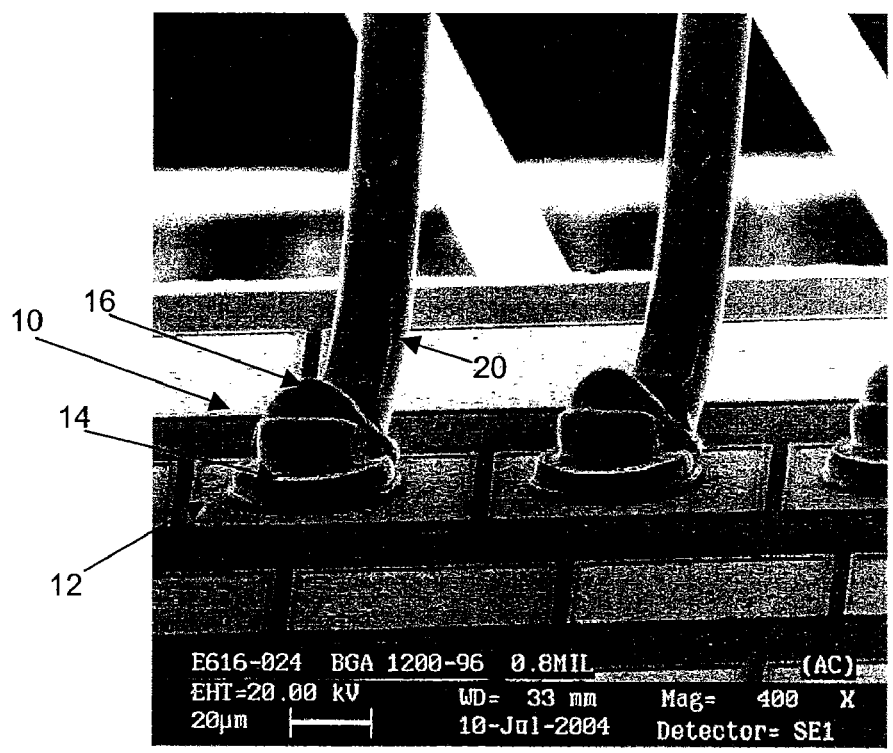
FIG. 2 is another side view of the ball bond seen from direction A in FIG. 1 showing the connection of the ball bond relative to the wire along a length of the wire.

FIG. 2 is another side view of the ball bond 10 seen from direction A in FIG. 1 showing the connection of the ball bond 10 relative to the wire 20 along a length of the wire 20. A plurality of bonding pads 12 and wire bonds 10 are shown. The rectangular bonding pads 12 are arranged in rows on a substrate. One wire bond 10 is formed on each bonding pad at each first bonding position. The orientation of the wire bond 10 permits a wire loop consisting of the wire 20 with a relatively low height profile to be formed.

FIGS. 3(a) to 3(e) show various stages of a motion profile of a wire bonding tool in the form of a wire bonding capillary 22 feeding bonding wire 20 to a bonding location to create a wire bond 10 according to the preferred embodiment of the invention. Preferably, the capillary 22 is attached to an ultrasonic transducer (not shown) of a wire bonder machine.

Figure 3:
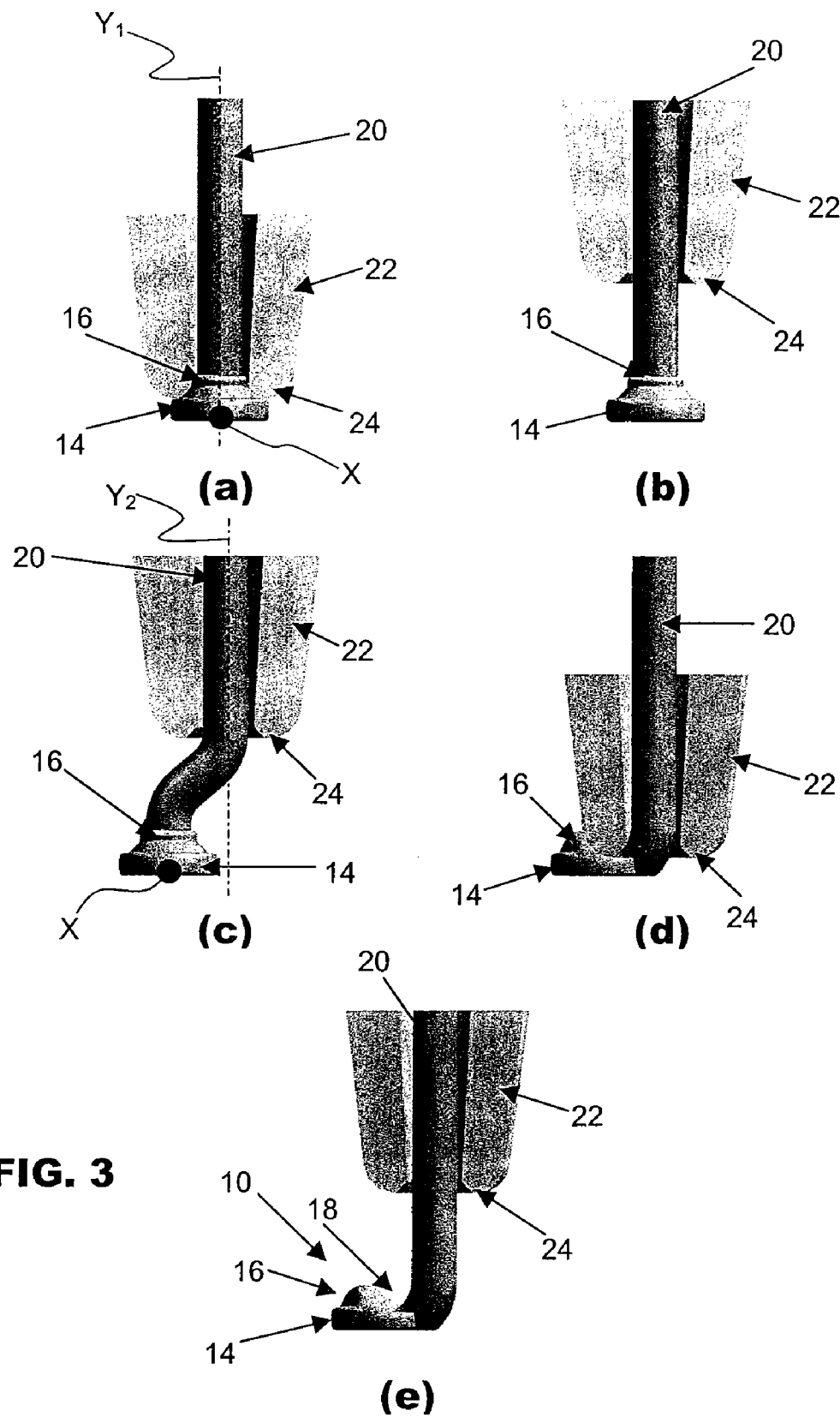
FIGS. 3(a) to 3(e) show various stages of a motion profile of a capillary feeding bonding wire to a bonding location to create a wire bond according to the preferred embodiment of the invention.

Bonding wire 20 is fed from a capillary tip 24 of the capillary 22. A length of wire exposed from the capillary tip 24 is first melted by an electric flame-off (EFO) operation to form a molten ball. The molten ball is then lowered to make contact with a bonding surface of a bonding pad. Bonding energy, which may comprise ultrasonic energy, is applied from the capillary 22 to attach the wire 20 to the bonding surface at the bonding location to form a first bond or ball bond. Referring first to FIG. 3(a), the molten ball has been lowered onto the bonding pad and ultrasonic energy has been provided to the capillary tip 22 to bond the wire 20 to the bonding pad. The welded bond thus formed has a base portion 14 and a ball portion 16 from which the remaining bonding wire 20 extends. At this time, a bonding point X of the attached wire lies along a central longitudinal axis $Y_1$ of the capillary 22.

As shown in FIG. 3(b), the capillary 22 is then lifted to a certain height above the bonding location (preferably a "search height") so that the capillary tip 24 is lifted away from the base portion 14 and ball portion 16. In FIG. 3(c), the capillary 22 is then moved to a position that is horizontally offset relative to the bonded base portion 14 and ball portion 16 so that a part of the capillary tip 24 is located over the ball portion 16. As seen in FIG. 3(c), the central longitudinal axis $Y_2$ of the capillary is now offset from the bonding point X of the attached wire. This is so that when the capillary 22 is lowered again, the capillary tip 24 will exert a force upon and penetrate the wire 20 at the edge of the ball portion 16 as described below.

In FIG. 3(d), the capillary tip 24 is moved with a constant search speed from the search height until it comes into contact with the ball portion 16 of the attached wire at the aforesaid offset position, and applies bonding force and power onto the ball portion 16. Ultrasonic energy is applied to the capillary tip 24 to deform and flatten an edge of the ball portion 16 near to a periphery of the base portion 14 until at least a portion of an underside of the deformation contacts the bonding pad. However, this action must be controlled so that the capillary tip 24 does not penetrate the ball portion 16 excessively so as to sever the wire 20 from the bond. The deformation of the ball portion 16 preferably serves to form a stitch bond at the edge of the base portion 14 and extend the area of the wire bond 10 that is in contact with the bonding pad. Thus, the underside of the deformation is preferably bonded to the bonding surface or pad. The contact area is extended, from the original base portion 14 of the wire bond 10 only, to include the base portion 14 together with the underside of the recessed portion 18 in contact with the bonding pad. This increase in contact area serves to consequently increase the bond shear strength.

In FIG. 3(e), after the ball portion 16 of the first or ball bond 10 is sufficiently depressed and the underside of the recessed portion 18 makes contact with the bonding pad, the capillary 22 is raised up so that the capillary tip 24 is lifted from the ball bond 10, revealing the recessed portion 18 of the ball bond 10. Thereafter, the capillary 22 is moved towards a second bonding position while extending the wire 20 from the recessed portion 18 to form a wire connection between two or more points.

It should be appreciated that although the above description refers specifically to the formation of a first bond or ball bond at a first bonding position using the method according to the invention, the invention is also applicable with suitable modification to the making of other types of wire bonds, including without limitation to the second bond or stitch bond at a second bonding position to which the capillary 22 is moved after forming a wire bond at the first bonding position. In this case, the length of wire extending from the second bond may be severed in order to terminate adjacent to the second wire bond if no further connections from the second bonding position are to be made.

Further, it is generally preferred that the position of the attached wire is maintained relatively stationary while moving the capillary 22 during the execution of the above bonding method, but it is possible to introduce corresponding movement of the position of the attached wire during any part of the above operations.

The following table containing ball shear data illustrates a comparison between a traditional single ball bond and a ball bond created using the preferred embodiment of the invention with improved adhesion between the ball bond and the bonding pad:

|  | Ball Shear Strength (gm) using invention | Ball Shear Strength (gm) using conventional bonding |
| --- | --- | --- |
| Maximum | 23.1 | 14.1 |
| Minimum | 17.4 | 11.1 |
| Mean | 20.2 | 12.5 |
| Standard Deviation | 1.32 | 0.83 |

In particular, it was found that the average ball shear for a bump ball formed on a bonding pad using a conventional wire bonding method according to a particular set of parameters was 12.5 grams. That means that the wire bond was dislocatable by applying a shearing force of 12.5 grams or more. When the ball bond was formed using the preferred embodiment of the invention using a similar set of parameters, the average ball shear increased to 20.2 grams. The improvement in ball shear strength of the bond from 12.5 grams to 20.2 grams amounts to about 62%.

It would be appreciated that an advantage of this method is that no increase in ultrasonic power for forming each bond is required to obtain the improvement in shear strength. Therefore, metal peel or cratering can be avoided or reduced as compared to the prior art. Another advantage is that a smaller ball size can be used to bond a wire to a larger opening of a connection pad. Thus, the wire bonds can be wholly located on the connection pads with greater repeatability during bonding. With the said advantages, parameter optimization for forming the first bond can be made simpler and more accurate.

Further, this method can obtain very low looping heights as compared to the aforementioned prior art bonding method. This improvement is advantageous since if the bonding wire is to be encapsulated with plastic material, a lower wire height means that a smaller package size can be achieved.

The invention described herein is susceptible to variations, modifications and/or additions other than those specifically described and it is to be understood that the invention includes all such variations, modifications and/or additions which fall within the spirit and scope of the above description.

The invention claimed is:

1. Method for bonding a wire to a bonding surface with a bonding tool, comprising the steps of:
   contacting the bonding surface with the wire at a bonding location;
   applying bonding energy from the bonding tool to attach the wire to the bonding surface at a bonding point lying along a central longitudinal axis of the bonding tool;
   moving the bonding tool away from the bonding location;
   contacting the attached wire with the bonding tool at the bonding location at an offset position where the central longitudinal axis of the bonding tool is offset from the bonding point; then
   applying bonding force and power to deform the attached wire until an underside of the wire not already in contact with the bonding surface contacts the bonding surface.

2. Method as claimed in claim 1, further comprising the step of extending the wire from the deformed portion in the attached wire after deforming the attached wire.

3. Method as claimed in claim 2, wherein the bonding location comprises a first bonding position, and the bonding tool is moved to a second bonding position after deforming the attached wire.

4. Method as claimed in claim 1, wherein the bonding location comprises a second bonding position of the wire to which the bonding tool is moved after forming a wire bond at a first bonding position.

5. Method as claimed in claim 4, further comprising the step of severing the wire from the wire bond after forming the wore bond at the second bonding position.

6. Method as claimed in claim 1, wherein said underside of the wire is bonded to the bonding surface.

7. Method as claimed in claim 1, wherein the step of moving the bonding tool away from the bonding location comprises the step of moving the bonding tool to a search height.

8. Method as claimed in claim 7, including the step of moving the bonding tool at a constant search speed from the search height until it contacts the attached wire at said offset position.

9. Method as claimed in claim 1, including maintaining a position of the attached wire relatively stationary while moving the bonding tool during execution of the method.

10. Method as claimed in claim 1, further including the step of first forming a molten ball at an end of the bonding wire before attaching the wire comprising the ball to the bonding location.

11. Method as claimed in claim 10, wherein the step of contacting the bonding tool at said offset position includes the step of first locating the bonding tool over an edge of the ball of wire and then lowering the bonding tool to deform the wire at an edge of the ball of wire.

12. Method as claimed in claim 11, including the step of forming a stitch bond at said edge of the ball of wire.

13. Method as claimed in claim 1, wherein the bonding tool comprises a capillary attached to an ultrasonic transducer of a wire bonder machine.

14. A wire bond produced by the method as claimed in claim 1.

* * * * *